(12) United States Patent
Bandara et al.

(10) Patent No.: US 6,580,089 B2
(45) Date of Patent: Jun. 17, 2003

(54) MULTI-QUANTUM-WELL INFRARED SENSOR ARRAY IN SPATIALLY-SEPARATED MULTI-BAND CONFIGURATION

(75) Inventors: Sumith V. Bandara, Stevenson Ranch, CA (US); Sarath D. Gunapala, Stevenson Ranch, CA (US); David Z. Ting, Arcadia, CA (US); John K. Liu, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 10/005,170

(22) Filed: Dec. 3, 2001

(65) Prior Publication Data

US 2002/0117658 A1 Aug. 29, 2002

Related U.S. Application Data

(60) Provisional application No. 60/250,896, filed on Dec. 1, 2000.

(51) Int. Cl.[7] ............................................... H01L 29/06
(52) U.S. Cl. ..................... 257/14; 257/185; 257/184; 257/432; 257/440; 438/48
(58) Field of Search ............................... 257/10–11, 14, 257/21, 184, 185, 189, 432, 440, 443, 458, 459; 438/20, 22, 48, 65, 66, 67, 73, 80, 982

(56) References Cited

U.S. PATENT DOCUMENTS

| | | | |
|---|---|---|---|
| 5,518,934 A | * 5/1996 | Forrest et al. | 438/73 |
| 5,818,066 A | * 10/1998 | Duboz | 257/21 |
| 5,969,375 A | * 10/1999 | Rosencher et al. | 257/21 |
| 6,054,718 A | 4/2000 | Dodd et al. | |
| 6,104,046 A | 8/2000 | Borenstain | |
| 6,133,571 A | 10/2000 | Dodd | |

* cited by examiner

Primary Examiner—David Nelms
Assistant Examiner—Long Tran
(74) Attorney, Agent, or Firm—Fish & Richardson P.C.

(57) ABSTRACT

Device designs and techniques for forming multiple-band quantum-well detectors.

13 Claims, 6 Drawing Sheets

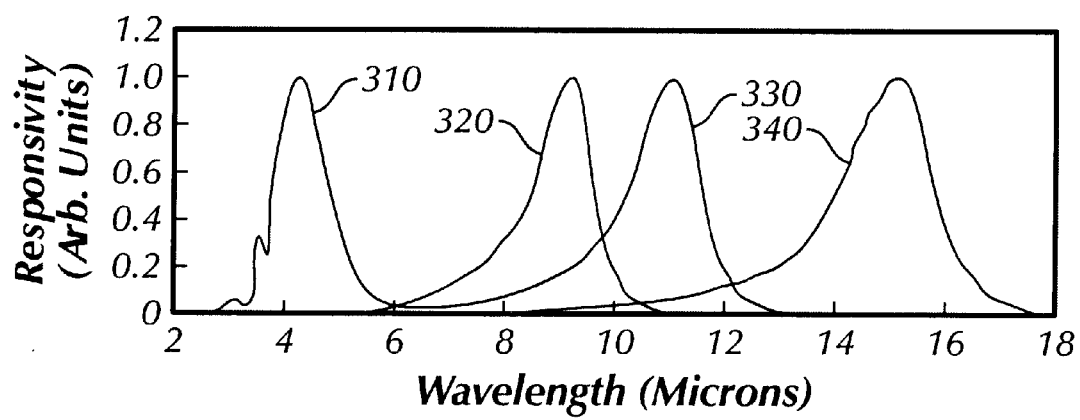
FIG. 4
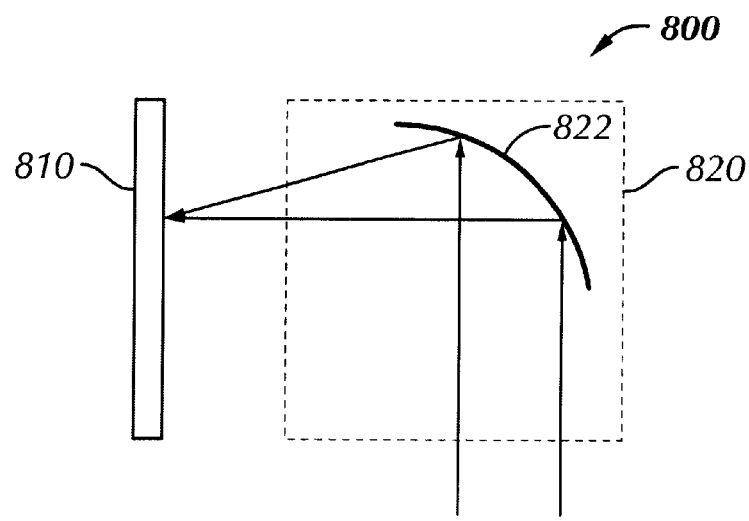
FIG. 8    Input Radiation

MULTI-QUANTUM-WELL INFRARED SENSOR ARRAY IN SPATIALLY-SEPARATED MULTI-BAND CONFIGURATION

This application claims the benefit of U.S. Provisional Application No. 60/250,896 filed Dec. 1, 2000.

ORIGIN

The devices and techniques described herein were made in the performance of work under a NASA contract, and are subject to the provisions of Public Law 96-517 (35 U.S.C. §202) in which the Contractor has elected to retain title.

BACKGROUND

This application relates to semiconductor radiation detectors, and in particular, to multi-quantum-well radiation detector arrays.

Semiconductor radiation detectors use optical absorption at optical transitions between two different energy levels to detect radiation by measuring the responses of the detectors caused by the optical absorption. Artificial multi-quantum-well structures have been used to construct various radiation detectors. The structures and properties of the multiple quantum wells can be selected to achieve desired detector performance with greater flexibility and freedom than extrinsically-doped semiconductor detectors. For example, an infrared quantum-well semiconductor detector usually includes a quantum-well structure formed of alternating active quantum well layers and barrier semiconductor layers. Such a quantum-well structure can have different energy bands each with multiple quantum states. An intraband transition between a ground state and an excited state in the same band (i.e., a conduction band or a valance band) can be used to detect infrared ("IR") radiation by absorbing IR radiation at or near a selected resonance IR wavelength. The absorption of the radiation generates electric charge indicative of the amount of received radiation. The radiation-induced charge can then be converted into an electrical signal (e.g., a voltage or current) to be processed by signal processing circuitry.

The compositions of lattice-matched semiconductor is materials of the quantum well layers can be adjusted to cover a wide range of wavelengths for infrared detection and sensing. Quantum-well structures can achieve, among other advantages, high uniformity, a low noise-equivalent temperature difference, large format arrays, high radiation hardness, and low cost.

SUMMARY

This application includes multi-quantum-well (MQW) detector devices that have a two-dimensional sensor array with spatially separated sensing regions responsive to different spectral bands. The sensor pixels in the sensor array have the same quantum-well construction which stacks together two or more different MQW structures respectively responsive to different spectral bands based on intrasubband transitions. Different pixels in different sensing regions, however, have different electrical configurations so that different sensing regions respectively detect radiation in their different, designated spectral bands. In addition, different pixels in different sensing regions also have different optical coupling designs so that the radiation of a designated wavelength for each sensing region is efficiently coupled into the active MQW structure in that pixel designed for detecting that designated wavelength.

BRIEF DESCRIPTION OF THE DRAWINGS

FIG. 4 shows the spectral responses of different MQW structures in each pixel as shown in FIG. 3.

FIG. 8 shows a multi-band imaging system with a reflective optical receiver.

DETAILED DESCRIPTION

The techniques and devices of this application are in part based on the recognition that the spectral information in an image of an object or scene can contain useful information on the properties of the object or the scene under detection. For example, different parts of the object or the scene may have different spectral characteristics. This difference may be reflected in the different spectral contents or compositions in received radiation signals from the different parts, or different relative and absolute signal strengths of different spectral components, or a combination thereof. Therefore, it may be desirable to obtain radiation images of the same object or scene at different wavelengths or spectral bands in some applications such as NASA's multi spectral sensor applications.

This application is also based on the recognition that conventional designs with different sensor arrays for detecting different spectral bands in a multi spectral sensor system can be costly, large in size, and can complicate the structure of the sensing system. Such conventional designs may not be suitable for some applications as in certain airborne systems and space flight missions where light weight and compact size are required.

In view of the above and other technical and commercial implications, this application teaches multi-quantum-well (MQW) detector devices that have a two-dimensional sensor array fabricated on a common substrate to have spatially separated sensing regions responsive to different spectral bands. The multiplayer structures of the sensor pixels of different sensing regions are identical but are configured differently in their optical and electrical configurations for sensing different spectral bands. Hence, a single sensing array can be used to capture images of the same object or scene at different wavelengths at the same time. In particular, since the different sensing regions are in the same focal plane, a single receiving optical train may be used for imaging to the different sensing regions. This sharing of the same optical system among different sensing regions eliminates the need for different designated optical systems for different sensors of different spectral bands used in some conventional multi-band imaging systems.

Figure 1:
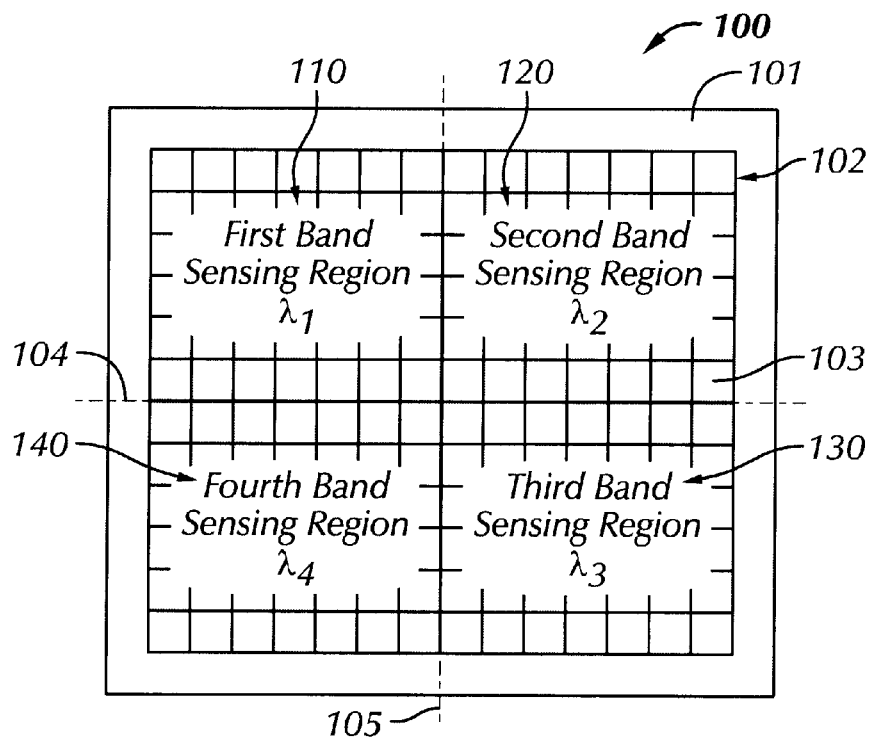
FIG. 1 shows a spatially separated 4-band MQW sensing array according to one embodiment.

FIG. 1 illustrates a multi-band MQW sensing array 100 according to one embodiment. The sensing array 100 is an integrated semiconductor device fabricated on a substrate 101 to form a 2-dimensional array 102 of sensor pixels 103 typically arranged in columns and rows. The array 102 may be generally configured to have two or more separate sensing regions and are shown in the illustrated example to have 4 such sensing regions 110, 120, 130, and 140. Lines 104 and 105 are shown to divide the sensing arrays into 4 different quadrants as different sensing regions at 4 different spectral bands or "colors". The sensing regions 110, 120, 130, and 140 are designed to respond only to their designated spectral bands centered at λ1, λ2, λ3, and λ4, respectively.

Figure 2:
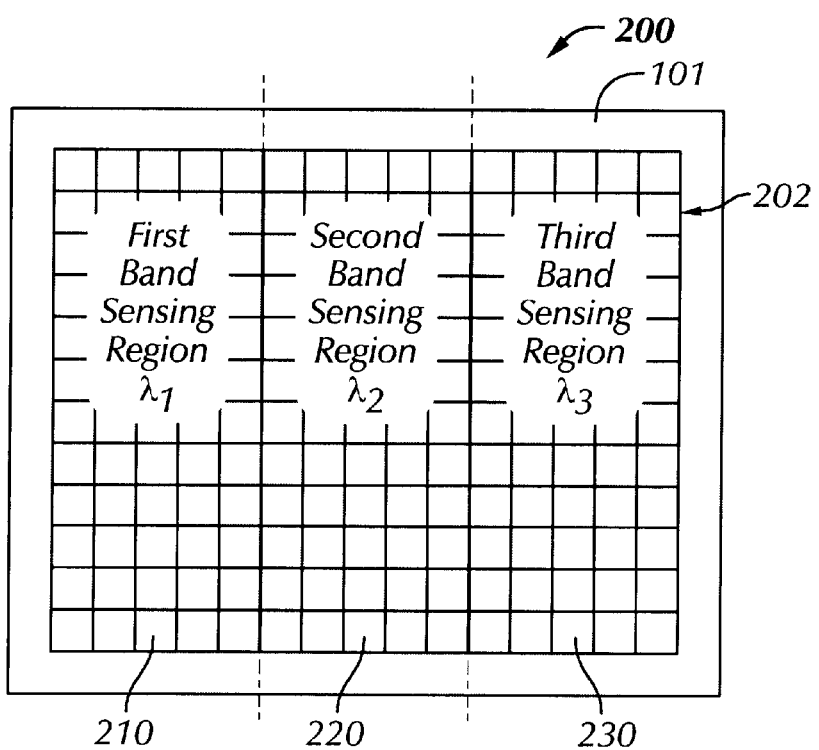
FIG. 2 shows a spatially separated 3-band MQW sensing array according to one embodiment

FIG. 2 illustrates another spatial arrangement for different sensing regions in a MQW imaging device 200 with a sensing array 202 formed on a substrate 101. The array 202 has two or more different sensing regions arranged consecutively in a row for detecting different spectral bands. An example of three sensing regions 210, 220, and 230 respectively responsive to spectral bands centered at λ1, λ2., and λ3 are illustrated.

Notably, the underlying multiplayer MQW structures of all pixels in the array 102 or 202 are identical to one another to allow for fabrication of pixels in different sensing regions through the same fabrication process. Each of the pixels has multiple MQW structures stacked over one another that are optically responsive to different spectral bands. A two-band sensing array would have two different MQE structures stacked over each other in each pixel; a three-band sensing array would have three different MQE structures stacked over one another in each pixel; a four-band sensing array would have four different MQE structures stacked over one another in each pixel, and so on.

Figure 3:
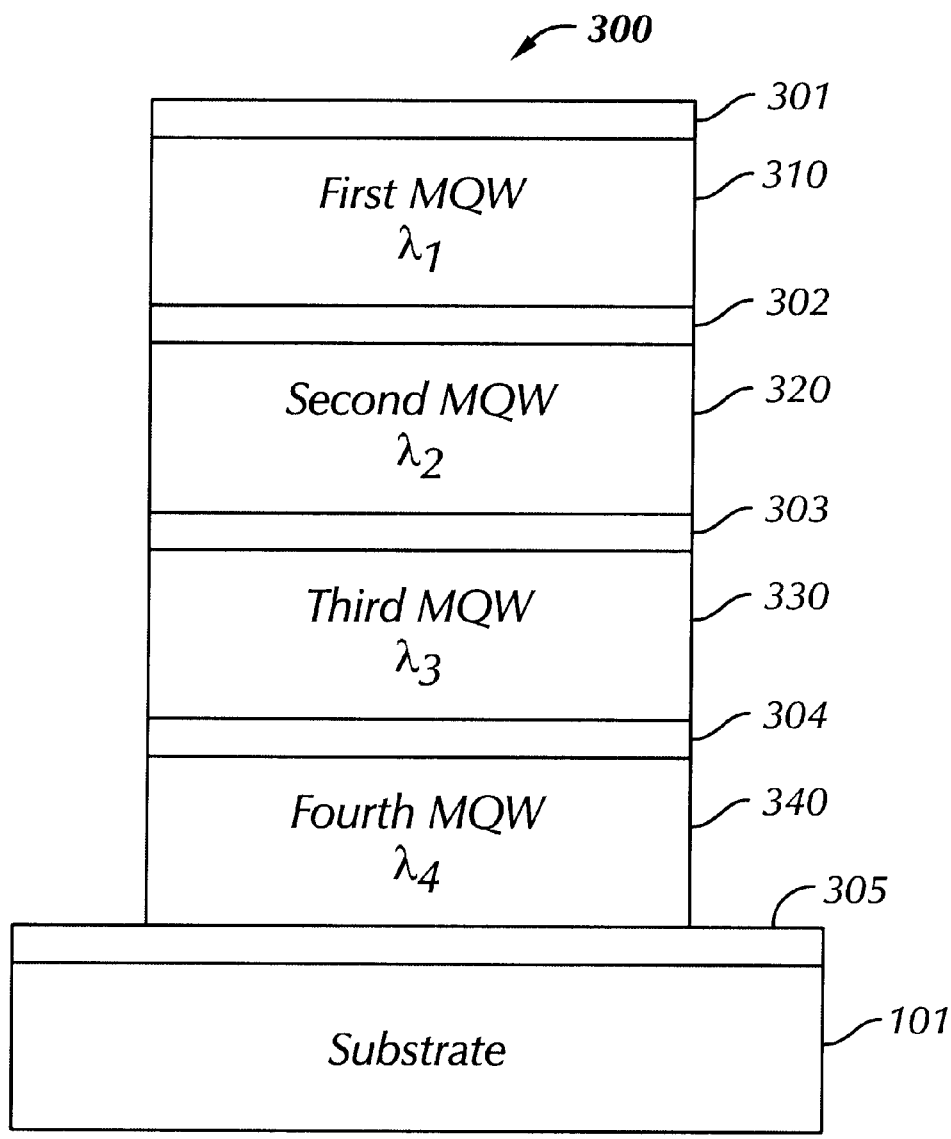
FIG. 3 shows a multi-layer construction in each pixel of the sensing array in FIG. 1.

FIG. 3 shows the underlying multiple layers common to all sensor pixels of the different sensing regions in the sensing array 102 of the 4-band imaging device 100 under one embodiment. Four different MQW structures 310, 320, 330, and 340 are fabricated over the substrate 101. Contact layers 301, 302, 303, 304, and 305, formed of a doped semiconductor material and being electrically conductive, are formed to interleave with the MQW structures 310, 320, 330, and 340 so that each MQW structure is sandwiched between two contact layers. The contact layer 305 directly formed on top of the substrate 101 may be a detector common contact layer which is continuous throughout the entire sensing array and is common to all sensing pixels in different regions. The top and bottom contact layers for each MQW structure are electrically biased to activate the MQW structure. In each sensing region, only one MQW structure for a spectral band centered at a designated wavelength is electrically activated in each pixel while MQW structures for sensing other bands are electrically shorted to be inactive. Details of such electrical configurations are to be described below.

Each MQW structure 310, 320, 330, or 340, has multiple quantum wells which are artificially fabricated by alternatively placing thin layers of two different, high-bandgap semiconductor materials adjacent to one another to form a stack. The bandgap discontinuity of two materials creates quantized subbands in the potential wells associated with conduction bands or valence bands. The structure parameters are designed so that light in resonance with a transition between a ground-state subband and a first excited-state subband of the same conduction or valence band is absorbed to generate photo-excited carriers. The carriers can escape from the potential wells and be collected as photocurrent.

In one implementation, the MQW structures 310, 320, 330, and 340 may be formed of a III-V semiconductor such as GaAs. GaAs forms the active quantum well layers and $Al_xGa_{1-x}As$ (0<x<1) forms the barrier layers that sandwich each GaAs quantum well layer. Accordingly, the contact layers 301, 302, 303, and 304 are heavily doped conductive GaAs. The amount of the aluminum in the barrier layers, x, can be set differently in different MQW structures 310, 320, 330, and 340 to achieve optical absorption at different wavelengths in the IR spectral range. The artificially created band structure can be controlled to achieve spectral bandwidth from narrow (Δλ/λ~10%) to wide (Δλ/λ~50%) in the wavelength range between 3–25 μm. Such MQW structures may be designed to have a superlattice design in which the barrier layers formed by $Al_xGa_{1-x}As$ are sufficiently thin to spatially overlap the wavefunctoins of the quantum wells formed by GaAs. For MQW structures at long IR wavelengths, the intersubband transition may be a bound-to-quasibound transition within the conduction band in an externally applied electric field where the excited state is in resonance with the well top. This configuration can reduce the dark current by having thick barrier layers that prohibit tunneling effects.

FIG. 4 shows the optical responses of MQW structures 310, 320, 330, and 340 based on $GaAs/Al_xGa_{1-x}As$ in an exemplary device. Each MQW structure has 30 periods of $GaAs/Al_xGa_{1-x}As$ layers and the substrate 101 is GaAs. Depending on the amount of the aluminum content, the MQW structure 310 may be set to operate approximately from 3 to 5 microns, the MQW structure 320 approximately from 8 to 10 microns, the MQW structure 330 approximately from 10 to 12 microns, and the MQW structure 340 approximately from 14 to 15.4 microns.

After the underlying multiple layers for the MQW structures shown in FIG. 3 are fabricated, photolithographic processing is applied to form the individual sensor pixels 103 by patterning the formed layers and to delineate the 4 different sensing regions 110, 120, 130, and 140 by deep grooves or trenches via etching. Next, the pixels in different sensing regions are fabricated to be optically and electrically different for selectively sensing different spectral bands.

Figure 5:
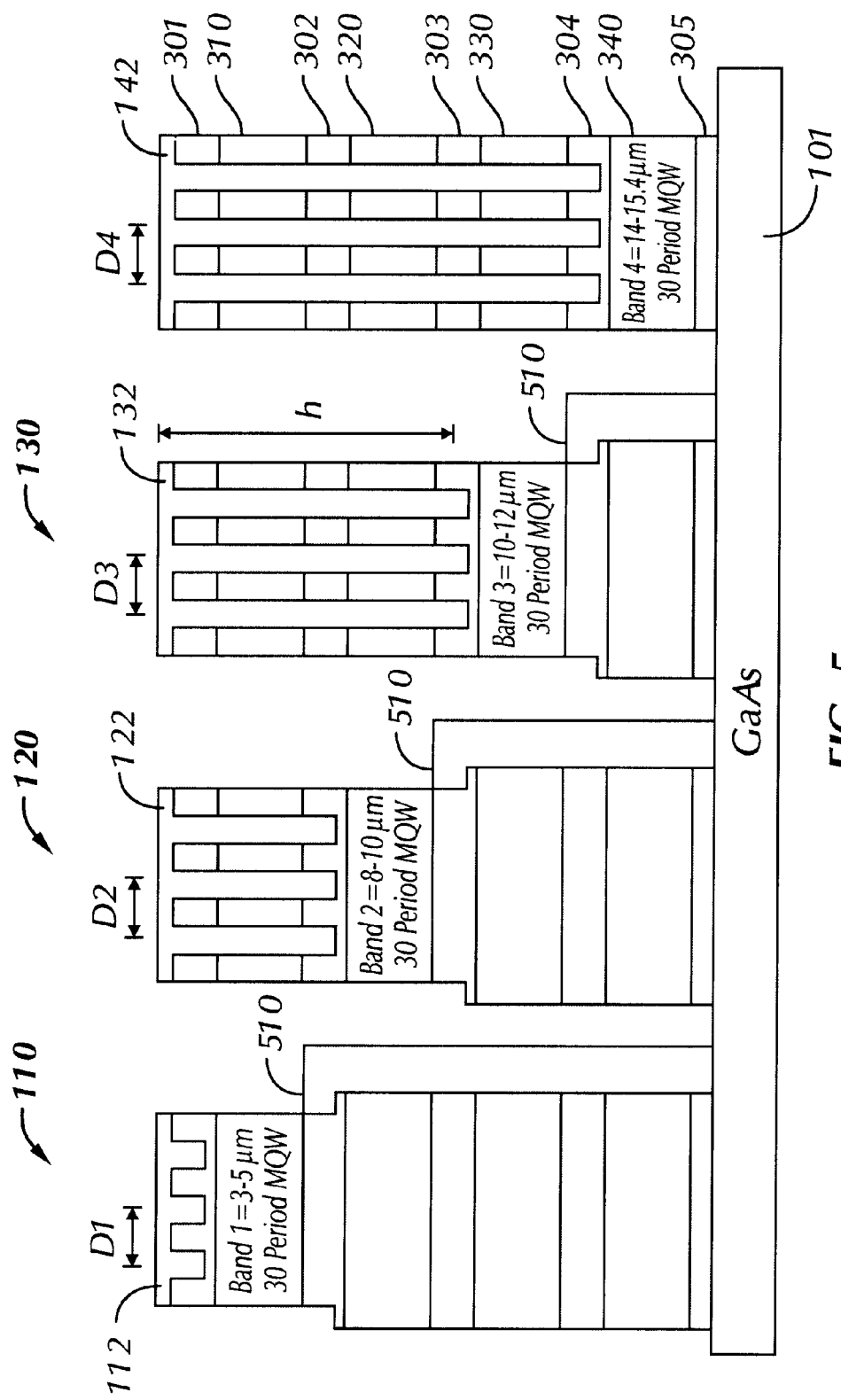
FIG. 5 shows different electrical and optical configurations of 4 different sensing pixels for 4 different spectral bands.

FIG. 5 shows representative sensor pixels from the 4 different sensing regions 110, 120, 130, and 140. In each sensing region, 3 out of the 4 MQW structures are electrically shorted to be inoperative and only one MQW structure is applied with a proper electrical bias to sense the light at the designated spectral band for the region. In the sensing region 110, the MQW structures 320, 330, and 340 are electrically shorted and the MQW structure 310 is biased to detect light at λ1; in the sensing region 120, the MQW structures 310, 330, and 340 are electrically shorted and the MQW structure 320 is biased to detect light at λ2; and so on.

Notably, a 2-dimensional metallic grating is formed on top of each pixel to operate as an optical grating coupler and as an electrical conductor to short the inactive and unused MQW structures. This grating is formed by first etching grating trenches and then filling the grating trenches with a metal such as gold. The depth of the grating trenches varies from one sensing region to another. In the sensing region 140 where MQW structures 310, 320, and 330 are electrically shorted, each grating trench extends from the top of the MQW structure 310 to the contact layer 304 underneath the MQW structure 330 to form the short circuit. The metallic grating teeth in the trenches form the 2-D grating 142 for the sensing region 140 and short the MQW structures 310, 320, and 330. In the sensing region 130, each grating trench extends from the top of the MQW structure 310 to the contact layer 303 underneath the MQW structure 320. The metallic grating teeth in the trenches form the 2-D grating 132 for the sensing region 130 and short the MQW structures 310 and 320. An electrically conductive vias 510, e.g., formed of a metal, is further formed on the exterior surface of the bottom MQW structure 340 to extend from the contact layer 304 to the bottom contact layer 305 underneath the MQW structure 340 to electrically short the MQW structure 340. A metallic grating 122 for the pixels in the sensing region 120 have grating teeth extending only to the contact layer 302 to short the top MQW structure 310. Hence, the vias 510 is used to short the bottom two MQW structures 330 and 340 by contacting the contact layers 303, 304, and 305. Finally, the metallic grating 112 for the pixels in the first sensing region 110 are formed in the top contact layer 301 so that the metallic layer 510 is used to form a short circuit for shorting the bottom three MQW structures 320, 330, and 340 by contacting the contact layers 302, 303, 304, and 305.

In addition to the electrical function, the metallic gratings 112, 122, 132, and 142 are also designed as an optical coupler for the sensing pixels. In one aspect, each grating is designed to have a grating period to efficiently diffract light at the designated wavelength to be absorbed by the respectively underlying MQW structure. Hence, gratings 112, 122, 132, and 142 may have different grating periods D1, D2, D3, and D4, respectively, which are selected to efficiently to couple light at λ1, λ2, λ3, and λ4, respectively. The grating period for all gratings 112, 122, 132, and 142 may also be the same. In another aspect, the length of the grating teeth of each grating is designed to direct the input light with a proper polarization to be absorbed by the respective active MQW structure. Quantum physics dictates that an intersubband transition is excited to absorb photons of input radiation only when the polarization or electric field of the photons has a component along the growth direction of a quantum-well structure, i.e., perpendicular to the quantum layers.

In this application, each metallic grating should be designed to (1) efficiently diffract input light into light at large diffraction angles and (2) minimize the efficiency for diffracting light into low diffraction angles close to the normal direction of the surface. The first condition may be met by designing the grating to have significant depth variation on the scale of one wavelength. The second condition may be achieved by designing the grating to produce destructive interference of all reflected waves in the direction normal to the surface. Thus, the depth h of the grating teeth should be set at $m\lambda_p/(4n)$, where m is an odd integer (1, 3, 5, etc.), $\lambda_p$ is the peak response wavelength of the underlying active MQW structure, and n is the refractive index of the semiconductor material surrounding the grating teeth (e.g. GaAs). For the first metallic grating 112, the depth h can be set to be the minimum value $\lambda_1/(4n)$. For gratings 122, 132, and 142, the depth of the grating must be a multiple of the minimum value, e.g., an odd number greater than 3, in order to reach the desired depth to achieve the corresponding electrical short. Hence, the depth h of the grating 122 may be $3\lambda_1/(4n)$, $5\lambda_1/(4n)$, or $7\lambda_1/(4n)$, etc.

In actual implementation, each pixel may be delineated by etching deep trenches to separate it from its neighboring pixels. Hence, an electrical shorting vias 510 is formed in each pixel that requires shorting (pixels in sensing regions 110, 120, and 130). Alternatively, only one shorting vias 510 may be commonly used for all pixels in one sensing region.

Figure 6:
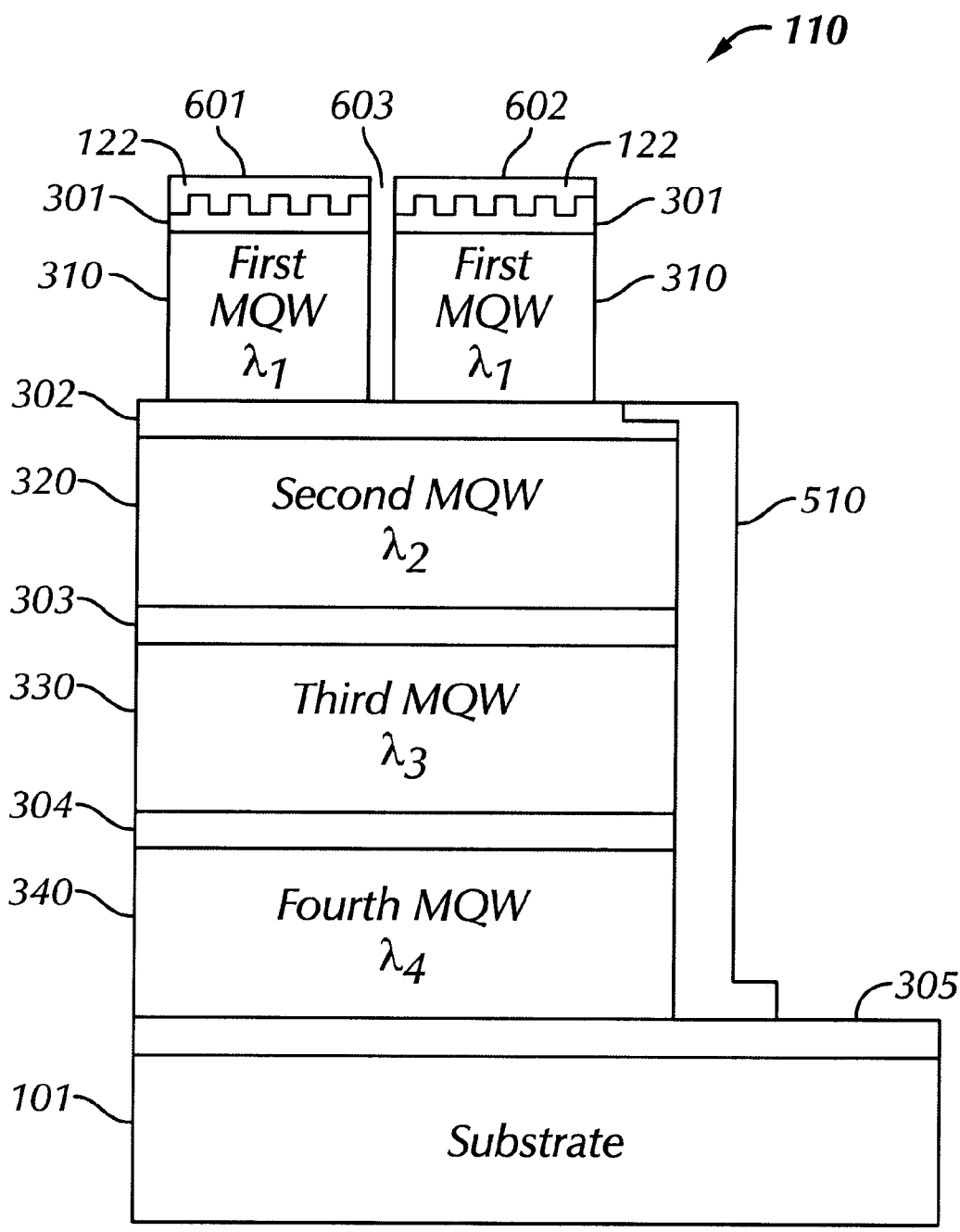
FIGS. 6 and 7 illustrate pixel designs and electrical shorting according to one embodiment.
Figure 7:
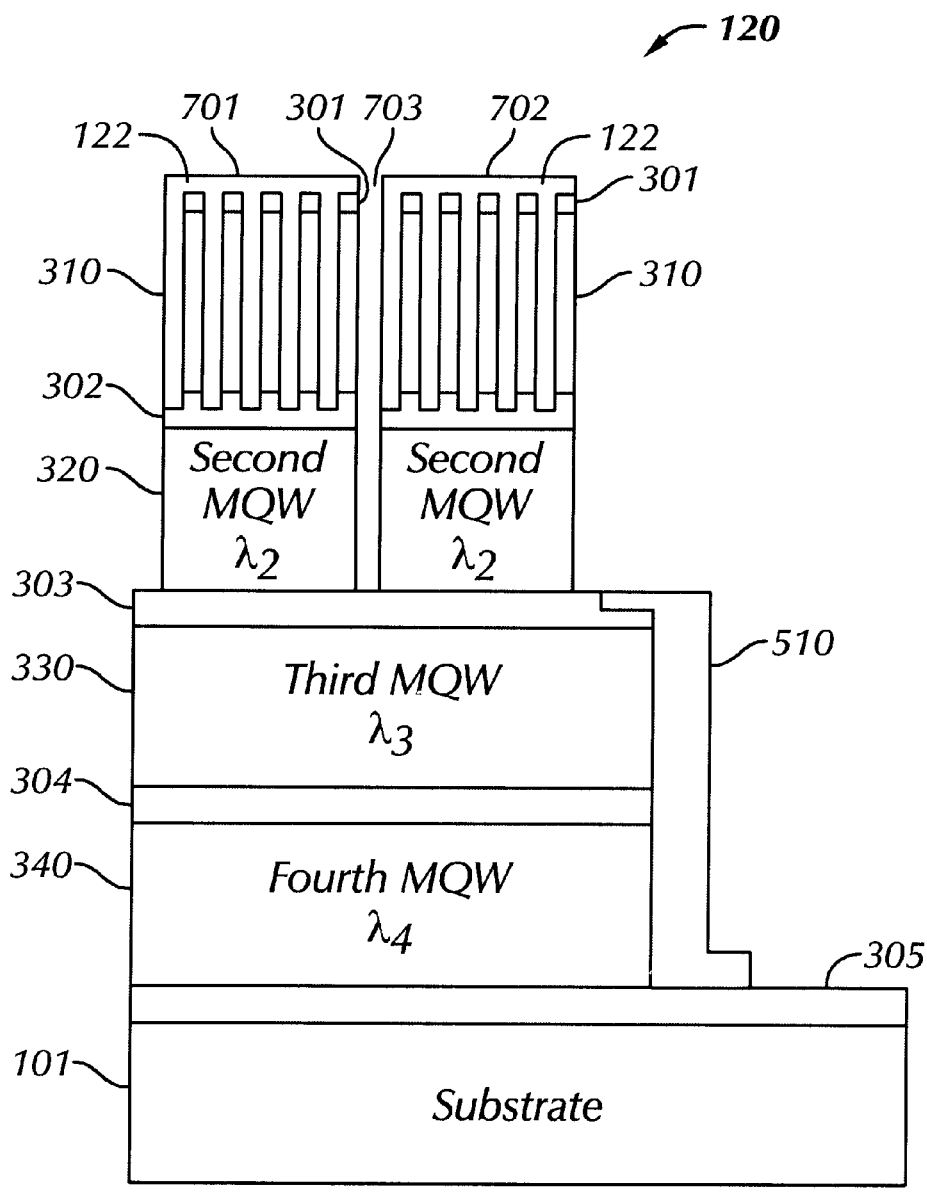

FIG. 6 illustrates one embodiment of this design for the example of the sensing region 110. The etched trenches 603 are only to the bottom of the MQW structures 310 to expose the underlying contact layer 302 to delineate pixels 601, 602, etc. Since the contact layer 302 is common to all pixels in the region 110 and to underlying MQW structure 302 in the illustrate configuration, a single vias 510 may be formed at one edge of the contact layer 302 to connect to the detector common contact layer 305 to short the MQW structures 320, 330, and 340 under all pixels in the region 110. FIG. 7 illustrates a similar implementation for the pixels in the sensing region 120 where separation trenches 703 are etched to the bottom of the second MQW structure 330 to form the pixels 701, 702, etc. within the region 120 and a single vias 510 is formed to short the contact layer 303 to the detector common contact layer 305. Certainly, more than one vias 510 may be used.

FIG. 8 illustrates s multi-band imaging system 800 using the above spatially-separated multi-band sensor array designs. The system 800 includes a focal plane sensor array 810 based on any one of the described embodiments and a single optical receiver 820 that projects the input radiation onto the array 810. The optical receiver 820 includes one or more reflective imaging surfaces 822 to form a single optical train for directing and focusing input radiation of all spectral bands of interest to the focal plane array 810. Each reflective surface may have the similar reflectivity for each spectral band and thus be achromatic within the spectral responsive range of all spectral bands of different regions of the sensing array. Such reflective optics is used here to avoid chromatic effects in optical lenses and other transmissive optical elements when in the input radiation has different spectral components.

Only a few embodiments are disclosed. However, it is understood that variations and enhancements may be made without departing from the spirit of and are intended to be encompassed by the following claims.

What is claimed is:

1. A device, comprising:
    a substrate formed of a semiconductor;
    a common contact layer formed on said substrate;
    a first sensing region formed over said common contact layer and having a plurality of adjacent first sensing pixels responsive to radiation at a first spectral band;
    a second sensing region formed over said common contact layer and spatially separated from said first sensing region, said second sensing region having a plurality of adjacent second sensing pixels responsive to radiation at a second spectral band,
    wherein each of said first and said second sensing pixels has a plurality of multiple-quantum-well (MQW) structures respectively responsive to different spectral bands formed over said common contact layer in a stack, and a plurality of contact layers to sandwich each MQW structure in combination with said common contact layer,
    wherein, in said first sensing region, a MQW structure responsive to said first spectral band is electrically biased to be active and other MQW structures are electrically shorted to be inactive, and
    wherein, in said second sensing region, a MQW structure responsive to said second spectral band is electrically biased to be active and other MQW structures are electrically shorted to be inactive.

2. The device as in claim 1, wherein one MQW structure includes alternating layers of GaAs and $Al_xGa_{1-x}As$ (0<x<1).

3. The device as in claim 1, further comprising an electrically conductive grating formed in each pixel, wherein said grating in one of said first and said second sensing region has grating teeth to penetrate through at least one MQW structure to electrically short contact layers between which said at least one MQW structure is located.

4. The device as in claim 3, wherein a length of said grating teeth of said one sensing region is 3λ/4n multiplied by an odd number greater than 3, where $\lambda$ is the wavelength to which said one sensing region is responsive to and n is a refractive index of the semiconductor.

5. The device as in claim 3, further comprising an electrical conductive vias to short at least one MQW structure that is not shorted by said grating teeth.

6. The device as in claim 1, wherein said multi-quantum-well structure has a structure to support a bound state and a quasibound state within a common energy band.

7. A device, comprising:

a substrate formed of a semiconductor;

a common contact layer formed on said substrate;

a focal plane imaging array having a first sensing region formed over said common contact layer and having a plurality of adjacent first sensing pixels responsive to radiation at a first spectral band, and a second sensing region formed over said common contact layer and spatially separated from said first sensing region, said second sensing region having a plurality of adjacent second sensing pixels responsive to radiation at a second spectral band, wherein each of said first and said second sensing pixels has a plurality of multiple-quantum-well (MQW) structures respectively responsive to different spectral bands formed over said common contact layer in a stack, and a plurality of contact layers to sandwich each MQW structure in combination with said common contact layer;

a plurality of optical gratings of an electrically conductive material formed on top of said first and said second sensing pixels and having grating teeth extending to at least one layer in each sensing pixel, wherein, in said first sensing region, a corresponding grating formed on top of a corresponding contact layer over a top MQW structure has grating teeth extended only in said corresponding contact layer, and in said second sensing region, a corresponding grating formed on top of a corresponding contact layer over a top MQW structure has grating teeth to penetrate through said top MQW structure to form an electrical short;

at least one first electrically conductive vias formed in said first sensing region with one end in contact with said common detector layer to electrically short each MQW structure underneath said top MQW structure in all first sensing pixels; and at least one second electrically conductive vias formed in said first sensing region with one end in contact with said common detector layer to electrically short each MQW structure underneath a second MQW structure immediately below said top MQW structure in all second sensing pixels.

8. The device as in claim 1, further comprising an optical imaging module in an optical path to said substrate to image an input image onto said focal imaging array.

9. The device as in claim 8, wherein said optical imaging module comprises of one or more reflective optical surfaces.

10. The device as in claim 3, wherein a length of said grating teeth of each grating is $3\lambda/4n$ multiplied by an odd number, where $\lambda$ is the wavelength to which said one sensing region is responsive to and n is a refractive index of the semiconductor.

11. The device as in claim 10, wherein a length of said grating teeth of each grating for said second sensing region is $3\lambda/4n$ multiplied by an odd number greater than 3.

12. The device as in claim 7, wherein one MQW structure includes alternating layers of GaAs and $Al_xGa_{1-x}As$ (0<x<1).

13. The device as in claim 7, wherein each grating is formed of gold.

* * * * *